United States Patent [19]
Estes

[11] Patent Number: 5,184,767
[45] Date of Patent: Feb. 9, 1993

[54] NON-WICKING SOLDER PREFORM

[75] Inventor: Howard S. Estes, Houston, Tex.

[73] Assignee: Compaq Computer Corporation, Houston, Tex.

[21] Appl. No.: 816,134

[22] Filed: Dec. 31, 1991

[51] Int. Cl.⁵ .............................................. B23K 35/14
[52] U.S. Cl. ...................................... 228/56.3; 228/13; 228/215
[58] Field of Search ........................ 228/56.3, 13, 15.1, 228/118, 180.1, 215

[56]  References Cited
U.S. PATENT DOCUMENTS

| | | | |
|---|---|---|---|
| 3,396,894 | 8/1968 | Ellis | 228/56.3 |
| 3,989,331 | 11/1976 | Hanlon | 339/17 CF |
| 4,723,923 | 2/1988 | Senor et al. | 439/853 |

OTHER PUBLICATIONS

Insulation/Circuits, Production Soldering Clinic, pp. 51,52, Oct., 1980.
Computer Design, Technology Review, p. 108, Nov., 1980.

Primary Examiner—Samuel M. Heinrich
Attorney, Agent, or Firm—Synnestvedt & Lechner

[57] ABSTRACT

Wicking-resistant solder preforms and methods for making such preforms are provided. The preforms include a solder layer for electrically mounting a lead to a printed circuit board upon heating the solder above its flow temperature. The preform also includes a flux layer disposed in contact with the solder layer and a wicking barrier disposed on a component-facing side of the solder layer for minimizing solder wicking along the lead during subsequent reflow soldering operations.

29 Claims, 2 Drawing Sheets

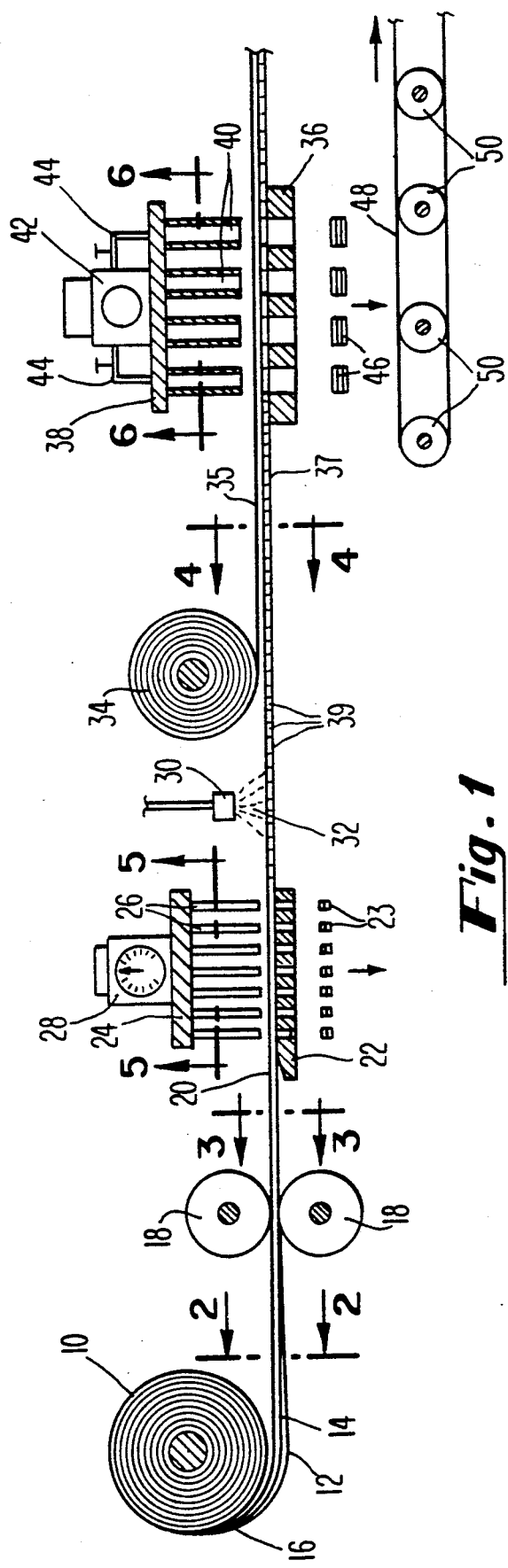
Fig. 1
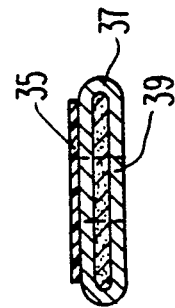
Fig. 3
Fig. 2
Fig. 4

NON-WICKING SOLDER PREFORM

FIELD OF THE INVENTION

This invention relates to methods for minimizing solder wicking during the manufacturing of printed circuit boards, and more particularly, to solder preforms having anti-wicking capabilities.

BACKGROUND OF THE INVENTION

Printed circuit boards ("PCBs") normally have many electronic components soldered to their conducing surfaces. Such devices can include surface mounted and leaded-through-hole components, such as a dual-inline-package ("DIP") or a pin grid array ("PGA"), which are carefully placed by machine or hand into the plated-through-holes or onto surface mount pads of the PCB and are then typically wave or reflow soldered in place.

As is often the case with large scale soldering techniques, flowing solder wets the surface mount pads or through the plated-through-holes of the PCB and tends to creep or "wick" up the lead of the component. Wicking, as it is known in the art, is undesirable because it can lead to component damage, lead socket inoperability, shorting and poor solder efficiency.

In an effort to overcome the wicking problem, PCB manufacturers have in the past employed strips of anti-wicking material or mechanical interruptions in connection with the lead assembly to minimize undesired solder flow. See Hanlon, U.S. Pat. No. 3,989,331 ("'331"); and Senor et al., U.S. Pat. No. 4,723,923 ("'923"), which are hereby incorporated by reference.

Hanlon '331 discloses a dual-in-line package socket assembly having a bend or "dap" in its elongated contact lead for providing an interference fit between a lead and its corresponding PCB hole. The dap also provides a mechanical interruption of solder wicking so that continued upward flow of solder during wave soldering is disrupted.

Hanlon's socket can additionally include a polyester wafer mounted directly to the underside of the assembly so as to substantially cover the cavity between the socket contact fingers to prevent solder build up. The wafer has slots which are dimensioned to closely approximate the cross-section of the leads of the contacts to thereby hold the wafer in place and prevent solder from flowing up the lead into the space between the contact fingers.

Alternatively, Hanlon '331 teaches that a solder barrier strip, such as a Teflon ® resin, epoxy or metal oxide can be applied to the surface of the contact lead to prevent wetting of the solder, and thus, wicking.

Senor et al. '923 provides an electrical lead socket assembly formed from a composite stamped fabrication. The lead of this assembly includes a strip of anti-wicking material, such as aluminum, which is applied to the composite prior to stamping. This anti-wicking strip deters solder bridging between the socket and the lower portion of its lead.

Although prior art solder barriers, wafers and anti-wicking strips have been adequate in overcoming the wicking problem in certain instances, these solutions require intricate and costly process steps for coating the lead assembly which are a burden to manufacturers in an already far too competitive market.

SUMMARY OF THE INVENTION

Wicking-resistant solder preforms are provided by this invention which include a solder layer for electrically mounting a lead to a printed circuit board upon heating the solder above its flow or melting temperature, a flux layer disposed in contact with the solder layer, and a wicking barrier disposed on a component-facing side of the solder layer for minimizing solder wicking along the lead. These preforms are suitable for mounting leads, such as those associated with electronic components, as well as lead sockets, to printed circuit boards.

This invention also provides a method for manufacturing wicking-resistant solder preforms, which includes providing a flux-cored solder wire, pressing the flux-cored solder wire into a strip, piercing the strip to provide a lead entry location, and then disposing a wicking barrier film on a first side of the pierced strip.

Accordingly, solder preforms and methods for preparing them are provided by this invention which provide a cost-efficient alternative to expensive anti-wicking layers found in the prior art. These preforms can be used with a variety of components including surface mountable and leaded-through-hole components, such as DIP and PGA electronic packages. The wicking barrier film of this invention has been demonstrated to substantially prevent wicking along component leads, which in turn, minimizes PCB rejects. It has been discovered that providing a wicking barrier film on a solder preform is much easier to accomplish than providing such a film on a connector. Moreover, the individual preforms of this invention are universal and can be employed in a myriad of applications.

In other aspects of this invention, solder preforms are provided which include a pair of Sn-Pb-containing solder layers having a flux layer disposed therebetween and an aperture punched through the solder layers for receiving a component lead. This preferred preform also includes a wicking barrier film adhered to a component-side of one of the solder layers. This wicking barrier film can include a flexible solder resist layer or a polymeric resin layer which is readily penetrable by the lead upon placement of the lead on a printed circuit board. Other preferred preform configurations of this invention include a plurality of apertures for accepting two or more leads of a multi-lead electronic component.

BRIEF DESCRIPTION OF THE DRAWINGS

The accompanying drawings illustrate preferred embodiments of this invention so far devised for the practical application of the principles thereof, and in which:

FIG. 1: is a partial cross-sectional, diagrammatic, side view of a manufacturing line for producing preferred wicking resistant solder preforms of this invention;

FIG. 2: is a cross-sectional view, taken through line 2—2 of FIG. 1, illustrating a preferred flux-cored solder wire starting material of the preferred process of this invention;

FIG. 3: is a cross-sectional view, taken through line 3—3 of FIG. 1, illustrating the elongated deformed strip of solder formed by passing the solder wire through a pair of press rolls;

FIG. 4: is a cross-sectional view, taken through line 4—4 of FIG. 1, illustrating the solder strip of FIG. 3 after a hole has been punched through it to provide a lead-receiving cavity, and a plastic film has been applied to a component-receiving side of the solder strip;

DETAILED DESCRIPTION OF THE INVENTION

Figure 5:
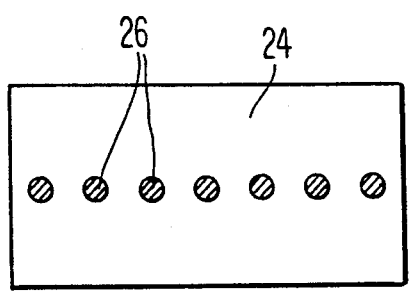
FIG. 5: is a cross-sectional view of the hole punch stamp press of FIG. 1, taken through line 5—5, illustrating a preferred arrangement of punches.
Figure 6:
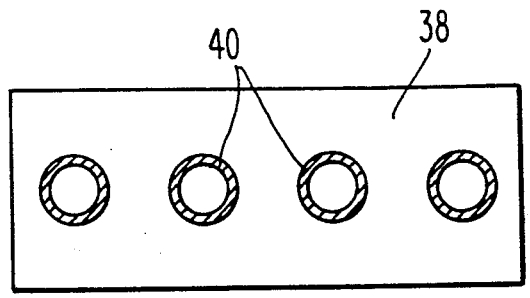
FIG. 6: is a cross-sectional view of the cutting stamp press of FIG. 1, taken through line 6—6, illustrating a preferred arrangement of cutting punches.

Wicking-resistant solder preforms and methods for their fabrication are provided by this invention. The preforms are designed to apply a predetermined amount of solder and flux to join a lead of a component or a lead socket to a designated plated-through-hole or surface mount pad of a printed circuit board. In an important aspect of this invention, the preforms include a wicking barrier, which is readily penetrable by a component lead during, for example, component placement, but which resists solder wicking during solder reflow operations so that the solder is concentrated in the plated-through-hole or pad region of the printed circuit board, and does not foul the electronic component or socket.

Referring now to FIG. 1, there is shown a diagrammatic side view of a preferred manufacturing process for preparing wicking-resistant solder preforms described by this invention. As illustrated, the preferred flux-cored solder wire 16 is distributed from a roll 10. Preferably, the solder wire 16 includes a Sn-Pb solder alloy with an acid flux, more preferably the alloy includes a 63Sn-37Pb low temperature solder. As illustrated in FIG. 2, the solder alloy 12 is generally concentric with the acid flux 14, and may be provided in various outer diameters, such as ⅛ inch, 3/32 inch, or 1/16 inch.

In order to achieve flat surfaces for the solder preforms, so that they may be placed on their designated positions on a printed circuit board, the solder wire 16 is reduced and deformed by press rolls 18 into a strip 20 having a flattened cross-section, such as that illustrated in FIG. 3. This flattened strip 20 of solder material is ready then for piercing and cutting by hole punch stamp press 28 and cutting stamp press 42, respectively.

At the hole punch stamp press 28, a series of holes or apertures 39 are formed in the flattened solder strip 20 by a plurality of circular punches 26. It is expected that these apertures can have cross-sections which are not circular, such as ovals, stars, rectangles or squares.

A preferred arrangement for the plurality of hole punches 26 is described in FIG. 5. These punches 26 are fixed onto an upper platen 24 which is subject to hydraulic or pneumatic pressure by the press 28. A lower platen 22 is provided with a plurality of apertures for receiving the punches 26, and solder plugs 23 which result from the forming operation. Following the application of the hole punch stamp press 28, the solder strip 20 and its encapsulated flux have a series of apertures 39 distributed therethrough.

The pierced strip of solder is then preferably coated with a thin layer of flux adhesive 32 by applicator 30. Applicator 30 preferably contains a spray nozzle, air knife or application roller for applying the flux adhesive in a uniform thickness along the top of the pierced solder strip.

A wicking barrier film 35 is then applied over the flux adhesive 32 by film roll 34. As illustrated in the cross-sectional illustration of FIG. 4, the now composite strip 37 contains a wicking barrier film 35 adhesively secured to a component-facing side of the pierced solder strip. The wicking barrier layer 35 preferably contains a material which impedes the flow of molten solder up the lead during reflow soldering operations, but is readily puncturable by the lead during placement. Thin films are ideally suited for this purpose such as those containing a flexible solder resist or a polymeric resin. Fluorocarbon resins, such as Teflon ® resin, are especially suited for this application since they have the added advantage of exhibiting high temperature stability, and will not degrade at soldering temperatures. Other polymers which may be suitable include polypropylene, polyethylene and nylon layers. In addition, thin metallic films, such as aluminum or tin foil are suitable for this purpose.

The composite strip 37 is then cut into preform configurations by cutting stamp press 42. This press 42 includes upper and lower platens 38 and 36, respectively, and a plurality of cutting punches 40. The cutting punches 40 can be configured in a variety of shapes, such as squares, rectangles, ovals, stars, or circles. In the preferred cutting stamp press 42 illustrated in FIG. 1, a series of cutting punches 40 having a circular cross-section are lowered, for example, by hydraulic or pneumatic pressure, into the composite strip 37 so as to press out a circular configuration 46, also shown in FIG. 7. Ejection assistance can be provided with pneumatic means 44 for applying pressurized gas to the interior space of the cutting punches 40 to eject the solder preforms 46 onto a rotating belt 48 supported by rollers 50. Alternatively, the solder preforms 46 can be ejected mechanically, for example, by plungers disposed in the punches 40.

Figure 7:
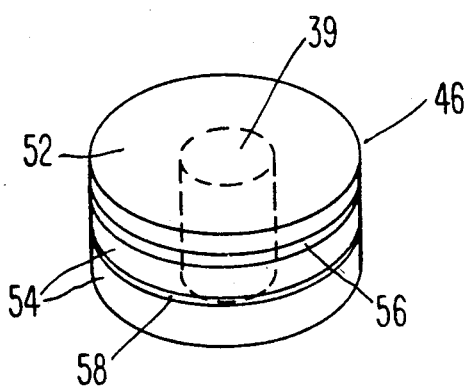
FIG. 7: is a perspective view of a preferred wicking-resistant solder preform illustrating its component layers.

With reference to FIG. 7, there is shown a preferred circularly configured, wicking-resistant solder preform 46 having a polymeric film 52 on a component-facing side of the preform 46. The preform includes an aperture 39 therethrough for receiving a lead and a pair of solder layers 54. Flux adhesive 56 is applied between the polymeric film 52 and a first of the solder layers and a flux layer 58 is disposed between the solder layers 54 for providing a cleansing and wetting action during soldering.

Figure 8:
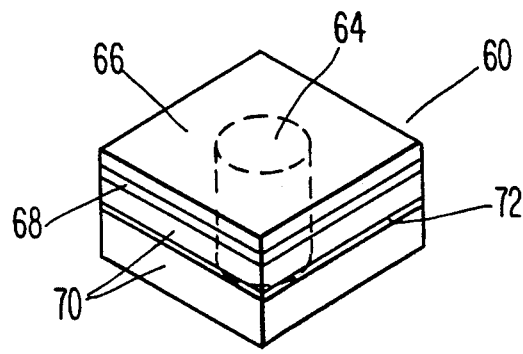
FIG. 8: is a perspective view of a second preferred wicking-resistant solder preform of this invention.

Similarly, a square configuration is illustrated in FIG. 8. This preform embodiment 60 includes a polymeric film 66, solder layers 70 and flux layers 68 and 72.

Figure 9:
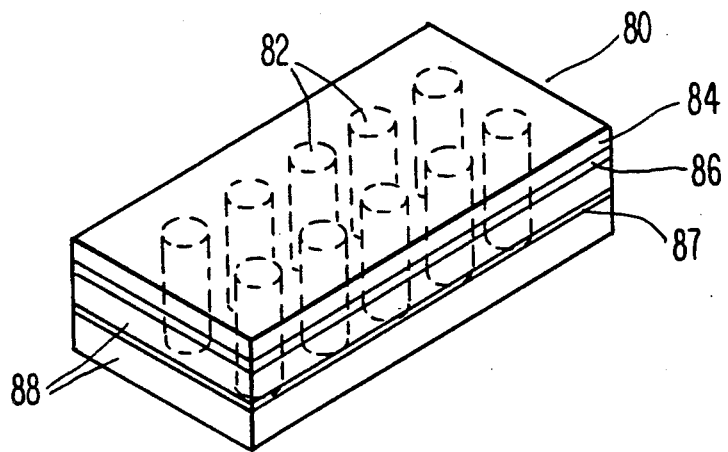
FIG. 9: is a perspective view of a third wicking resistant solder preform of this invention having multiple-lead-receiving apertures therein.

This invention also provides solder preforms having a plurality of apertures, such as that described by preform 80 of FIG. 9. This preform 80 has a plurality of linearly aligned apertures 82 for receiving a dual-inline-package component. As in the embodiments 46 and 60, this preform includes a polymeric film 84, solder layers 88 and flux layers 86 and 87.

The preforms of this invention can be conveniently employed in soldering components to printed circuit boards by first pre-locating the preforms over the plated-through-holes or surface mount pads typically found on such boards. The electronic components can then be hand or machine placed into the preforms so as to permit the leads to puncture the wicking barrier layers whereby the leads are inserted into the aperture of the preform and into the plated-through-holes or on the surface mount pads of the printed circuit board. Alternatively, the electronic component can be pre-placed into the solder preforms prior to placement onto the circuit board. In either case, the preform is preferably located around the lead prior to heating the circuit board up to the reflow soldering temperatures.

Reflow soldering can be accomplished, for example, by oven baking the board for about 40–50 seconds, preferably about 45 seconds, at a temperature of about 175°–200° C. preferably about 183° C., to reflow the solder and secure the leads of the electronic component to the plated-through-holes or pads of the printed circuit board. Both top and bottom side components can similarly be applied to the circuit board, although it is desirable that the board be flipped over prior to mounting the bottom side components.

From the foregoing, it can be realized that this invention provides cost-efficient and universal wicking-resistant solder preforms and methods for their fabrication. Preforms are provided in various configurations including those for receiving single and multiple pin arrangements. The described preforms obtain the advantages of minimizing soldering defects without the complications associated with providing solder resistant strips on the lead or component assemblies themselves. Although various embodiments have been illustrated, this was for the purpose of describing, and not limiting the invention. Various modifications which will become apparent to one skilled in the art are within the scope of this invention.

What is claimed is:

1. A wicking-resistant solder preform, suitable for mounting a lead to a printed circuit board comprising:
    a solder layer for electrically mounting said lead to said printed circuit board upon heating said solder above its flow temperature said solder layer comprising an aperture therein for receiving said lead;
    a flux layer disposed in contact with said solder layer;
    a wicking barrier disposed on a component-facing side of said solder layer and disposed for minimizing solder wicking along said lead.

2. The solder preform of claim 1 wherein said solder layer comprises a portion of a flux-cored solder strip.

3. The solder preform of claim 2 wherein said solder comprises Sn-Pb solder.

4. The solder preform of claim 3 wherein said solder contains about 63 wt. % Sn and about 37 wt. % Pb.

5. The solder preform of claim 3 wherein at least said solder layer has a plurality of apertures corresponding to a plurality of leads of a multi-lead electronic component.

6. The solder preform of claim 1 wherein said flux layer comprises an acid flux.

7. The solder preform of claim 1 wherein said wicking barrier comprises a solder resist layer or a plastic layer.

8. The solder preform of claim 7 wherein said plastic layer comprises a fluorocarbon resin.

9. The solder preform of claim 7 wherein said plastic film is adhered to said solder layer with a flux adhesive.

10. A wicking-resistant solder preform for mounting a lead to a printed circuit board, comprising:
    a pair of solder layers for electrically mounting said lead to said printed circuit board upon heating said solder above its flow point;
    a flux layer disposed between said pair of solder layers; said solder layers and said flux layer having at least one aperture therethrough for receiving said lead; and
    a wicking barrier disposed on a component-facing side of a first of said solder layers, said wicking barrier being penetrable by said lead.

11. The solder preform of claim 10 comprising a plurality of apertures disposed through said solder layers and said flux layer and corresponding to a plurality of leads for a dual-in-line electronic component.

12. The solder preform of claim 10 wherein said solder layers comprise a Sn-Pb solder.

13. The solder preform of claim 12 wherein said wicking barrier comprises a flexible solder resist or plastic layer.

14. The solder preform of claim 13 wherein said plastic layer comprises a fluorocarbon film.

15. The solder preform of claim 13 wherein said plastic film is adhered to said first solder layer with a flux adhesive.

16. A wicking-resistant solder preform, suitable for mounting a lead to a printed circuit board, comprising:
    a pair of Sn-Pb-containing, solid, solder layers having an aperture therethrough for receiving said lead; and
    a wicking barrier film adhered to a component-side of said solder layers, said wicking barrier film being readily penetrable by said lead upon placement of said lead on said printed circuit board.

17. The solder preform of claim 16 wherein said preform contains a generally circular cross-section.

18. The solder preform of claim 16 wherein said wicking barrier film comprises a flexible solder resist or a plastic sheet.

19. The solder preform of claim 18 wherein said plastic sheet comprises a fluorocarbon resin.

20. The solder preform of claim 16 wherein said wicking barrier layer substantially minimizes wicking along said lead.

21. A method of preparing a wicking-resistant solder preform, comprising:
    providing a fluxed core solder;
    pressing said fluxed core solder into strip form;
    piercing said strip to provide a lead entry location;
    disposing a wicking barrier film on a first side of said pierced strip of fluxed core solder.

22. The method of claim 21 wherein said fluxed cored solder comprises a Sn-Pb solder.

23. The method of claim 21 wherein said pressing step comprises rolling said flux cored solder between a pair of pressed rolls.

24. The method of claim 21 wherein said piercing step comprises stamping a plurality of holes in said strip.

25. The method of claim 24 wherein said disposing step comprises applying a flux adhesive to a first surface of said strip.

26. The method of claim 25 further comprising applying a flexible solder resist or a plastic film on said flux adhesive.

27. The method of claim 21 further comprising stamping said wicking barrier film and said pierced strip to provide a discrete solder preform having at least one receiving cavity therein.

28. The method of claim 21 wherein said at least one receiving cavity comprises a plurality of lead receiving cavities.

29. A solder preform prepared by the method of claim 21.

* * * * *